United States Patent
Fulford, Jr. et al.

[19]

[11] Patent Number: 5,918,129
[45] Date of Patent: Jun. 29, 1999

[54] METHOD OF CHANNEL DOPING USING DIFFUSION FROM IMPLANTED POLYSILICON

[75] Inventors: H. Jim Fulford, Jr.; Robert Dawson, both of Austin; Mark I. Gardner, Cedar Creek; Frederick N. Hause, Austin; Mark W. Michael, Cedar Park; Bradley T. Moore; Derick J. Wristers, both of Austin, all of Tex.

[73] Assignee: Advanced Micro Devices, Inc., Sunnyvale, Calif.

[21] Appl. No.: 08/806,562

[22] Filed: Feb. 25, 1997

[51] Int. Cl.$^6$ .................................................. H01L 21/336
[52] U.S. Cl. ............................................ 438/289; 438/564
[58] Field of Search ..................... 438/289, 291, 438/532, 564, 923

[56] References Cited

U.S. PATENT DOCUMENTS

| | | | |
|---|---|---|---|
| 4,332,076 | 6/1982 | Solo de Zaldivar | 438/291 |
| 5,141,895 | 8/1992 | Pfiester et al. | 438/923 |
| 5,153,146 | 10/1992 | Toyoshima et al. | 438/923 |
| 5,532,188 | 7/1996 | Wright | 438/631 |
| 5,552,996 | 9/1996 | Hoffman et al. | 438/692 |
| 5,598,010 | 1/1997 | Uumatsu | 257/48 |
| 5,618,757 | 4/1997 | Bothra et al. | 438/699 |
| 5,702,564 | 12/1997 | Shen | 216/67 |
| 5,723,234 | 3/1998 | Yokoyama et al. | 430/5 |
| 5,736,442 | 4/1998 | Mori | 438/279 |

OTHER PUBLICATIONS

Wolf, "Silicon Processing for the VLSI Era"; vol. 2 pp. 12–13, 17–19, 45, 66, 1990.
IEDM Technical Digest, H. Sayama, et al. "Low Voltage Operation of Sub–Quarter Micron W–Polycide Dual Gate CMOS with Non–Uniformly Doped Channel", Dec. 8–11, 1996, 96–583 through 96–586.
Silicon Processing for the VLSI Era—vol. 1: Process Technology, by S. Wolf, published by Lattice Press, Sunset Beach, CA, 1986, pp. 182–327.
Silicon Processing for the VLSI Era—vol. 2: Process Integration, by S. Wolf, published by Lattice Press, Sunset Beach, CA, 1990, pp. 124–131.

*Primary Examiner*—Chandra Chaudhari
*Attorney, Agent, or Firm*—Skjerven, Morrill, MacPherson, Franklin & Friel LLP; Ken J. Koestner

[57] ABSTRACT

A method of doping an integrated circuit device channel in a semiconductor substrate laterally enclosed by an isolation structure is disclosed. The method includes steps of forming a thin oxide layer overlying the integrated circuit device channel and the isolation structure, depositing a polysilicon blanket layer overlying the thin oxide layer, patterning a photoresist mask overlying the polysilicon blanket layer and implanting dopant impurities into the polysilicon blanket layer. The method further includes steps of diffusing the dopant impurities from the polysilicon blanket layer through the thin oxide layer into the integrated circuit device channel, removing the polysilicon blanket layer, and removing the thin oxide layer.

18 Claims, 2 Drawing Sheets

METHOD OF CHANNEL DOPING USING DIFFUSION FROM IMPLANTED POLYSILICON

BACKGROUND OF THE INVENTION

1. Field of the Invention

The present invention generally relates to a method of manufacturing integrated circuit devices on semiconductor substrates. More specifically, the present invention relates to a processing method for doping the channel region of a semiconductor device.

2. Description of the Related Art

In many Metal Oxide Semiconductor (MOS) integrated circuit applications, transistor performance is highly dependent on the ability to set and maintain a uniform and stable threshold voltage $V_T$. One technique for controlling threshold voltage $V_T$ is implantation to properly set the net dopant concentration at the surface of a silicon wafer. In this manner, threshold voltage $V_T$ is selected on the basis of device performance alone. A $V_T$-adjust implant technique involves depositing and etching a threshold mask, then implanting boron, phosphorus or arsenic ions directly into the substrate or through a thin oxide layer to the regions under the gate oxide of a MOSFET. Boron implantation produces a positive shift in threshold voltage $V_T$. Phosphorus or arsenic implantation causes a negative shift. The $V_T$-adjust implant is often performed through an oxide layer with the implant energy selected to place the peak of the implant slightly below the oxide-silicon interface. Following an implant-activating anneal step, the implanted distribution is broadened.

One problem with the $V_T$-adjust implant is that the dopant profile in a device channel is nonuniform due to the introduction of extra ions into the channel depletion region of the device, causing the width of the channel depletion region to be modified. The non-uniform doping profile changes the long-channel subthreshold characteristics of the device as well as the punchthrough behavior of short-channel devices.

Another problem with the $V_T$-adjust implant is that the implant depth is difficult to control so that shallow depths are difficult to achieve. A shallow implant is difficult to achieve using the $V_T$-adjust implant due to limitations on energy of an implant device. For example, boron molecules are very small so that even a minimal implant energy drives the boron molecules an unsuitable depth into the substrate. $BF_2$ molecules are larger and therefore more easily implanted to a shallower depth although further limitations on implant depth are desired. Increasing implant depth disadvantageously creates channeling effects, creates lattice damage, and increases the voltage drop between the implant and the substrate surface.

What is needed is a technique for doping the channel of a semiconductor device that facilitates control of the impurity concentration within the channel, promotes a shallow dopant depth and improves the uniformity of dopant concentration in the channel.

SUMMARY OF THE INVENTION

In accordance with the present invention, a method of doping an integrated circuit device channel in a semiconductor substrate laterally enclosed by an isolation structure is disclosed. The method includes steps of forming a thin oxide layer overlying the integrated circuit device channel and the isolation structure, depositing a polysilicon blanket layer overlying the thin oxide layer, patterning a photoresist mask overlying the polysilicon blanket layer and implanting dopant impurities into the polysilicon blanket layer. The method further includes steps of diffusing the dopant impurities from the polysilicon blanket layer through the thin oxide layer into the integrated circuit device channel, removing the polysilicon blanket layer, and removing the thin oxide layer.

Many advantages are achieved by the described method. Threshold voltage setting using the diffusion technique advantageously permits precise control of the dopant concentration in the device channel region while attaining a substantially shallower dopant profile than is possible using a threshold implant. Furthermore, while dopants are implanted at conventional implant energies into the polysilicon layer, impurities advantageously extend on a shallow depth into the silicon through the usage of a diffusion process to create a dopant distribution.

Also, the diffusion technique advantageously allows doping of a particular type of devices without contaminating complementary devices.

BRIEF DESCRIPTION OF THE DRAWINGS

The features of the described embodiments believed to be novel are specifically set forth in the appended claims. However, embodiments of the invention relating to both structure and method of operation, may best be understood by referring to the following description and accompanying drawings.

DETAILED DESCRIPTION OF THE PREFERRED EMBODIMENTS

Figure 1A:
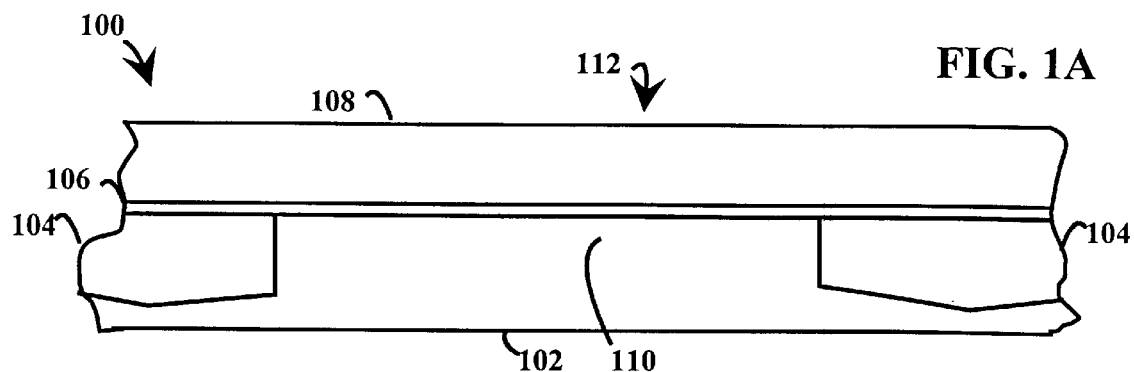
FIGS. 1A through 1D depict a sequence of cross-sectional views showing steps of a method of processing a semiconductor wafer for channel doping using diffusion from implanted polysilicon in accordance with an embodiment of the present invention.

Referring to FIG. 1A, a cross-sectional view of a semiconductor wafer 100 is shown including a substrate wafer 102 and a plurality of isolation structures 104 for separating and electrically isolating individual devices within the substrate wafer 102.

The isolation structures 104 are a suitable isolation structure for isolating devices and preventing dopant interdiffusion between complementary wells within the substrate. In the illustrative example, the substrate wafer 102 includes a P-channel region 110 for an N-MOSFET device 112. Suitable isolation structures 140 include trench oxide and Local Oxidation of Silicon (LOCOS) structure. The substrate wafer 102 is typically a silicon substrate having a suitable thickness for forming transistors and devices.

A thin silicon dioxide (oxide) layer 106 is formed in a blanket covering the substrate wafer 102 and the isolation structures 104. The oxide layer 106 typically is deposited to a depth in a range of approximately 30 Å to 50 Å. A blanket polysilicon layer 108 is deposited overlying the oxide layer 106 and having a depth ranging from approximately 200 Å to about 2000 Å. Most typically, the polysilicon layer 108 is deposited to a depth from 400 Å to 1000 Å.

Figure 1B:
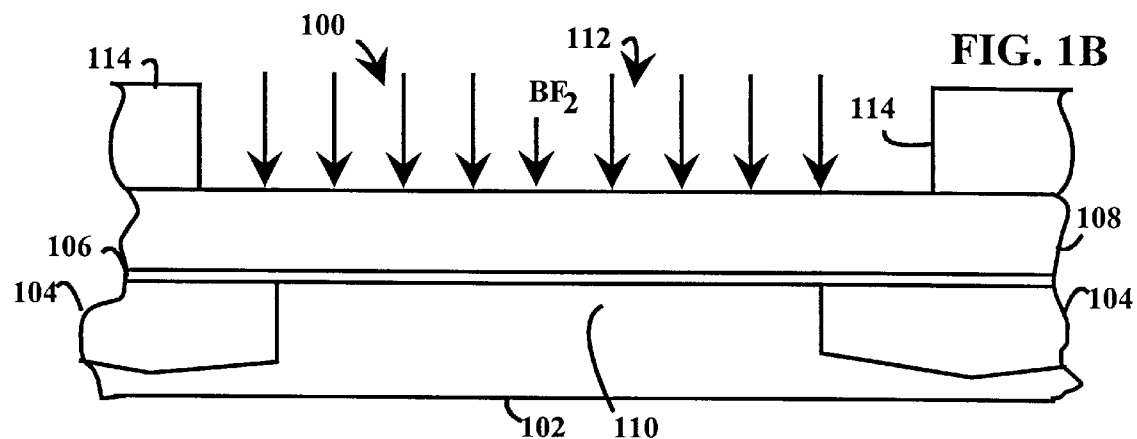
Figure 2:
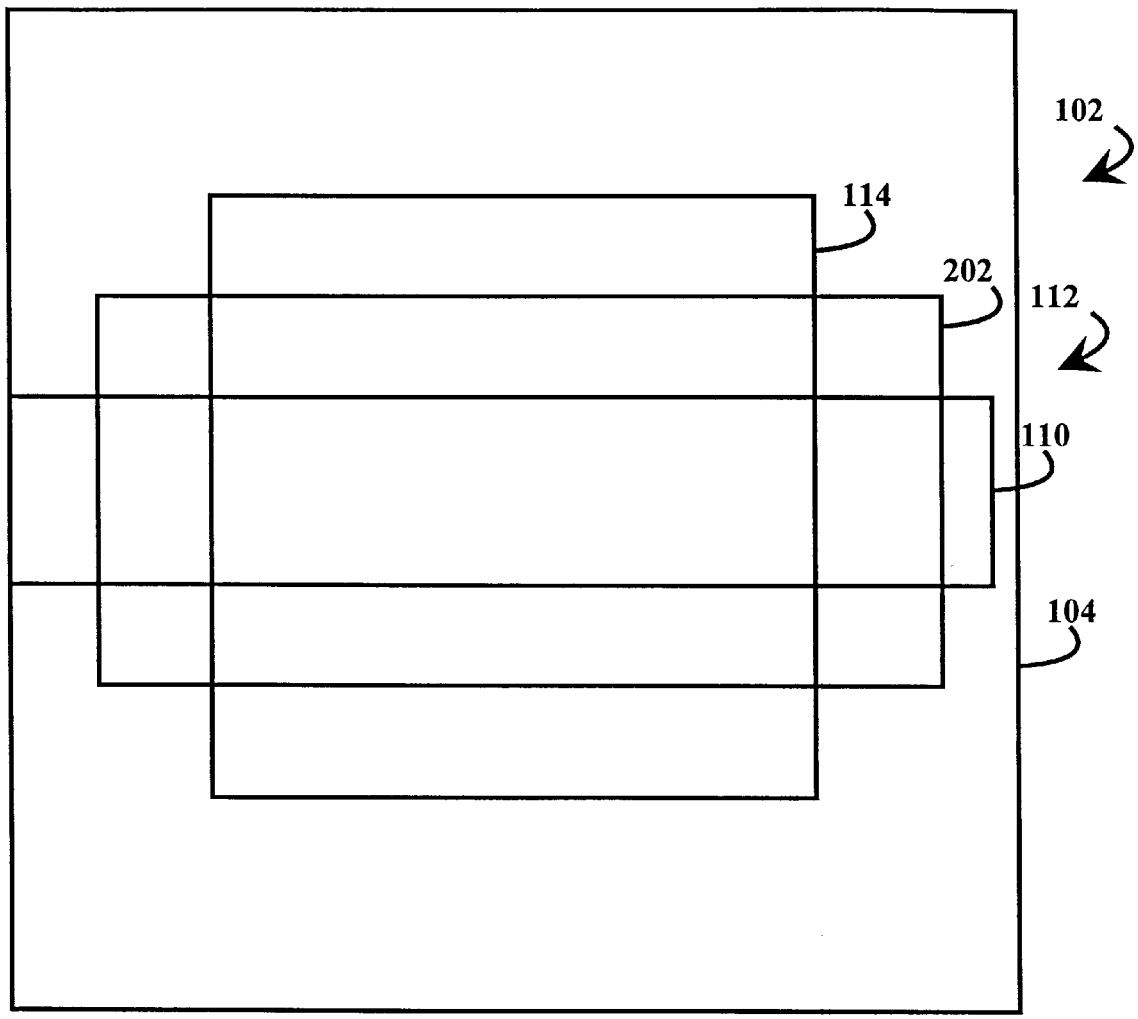
FIG. 2 is an overhead view of the substrate wafer showing the relative positions of isolation structures and the polysilicon mask in accordance with an embodiment of the present invention.

Referring to FIG. 1B, a photoresist mask 114 is formed covering the polysilicon layer 108, patterned and etched to extend completely across the device regions of the substrate wafer 102 to a position overlying the isolation structures 104. The photoresist mask 114 is recessed back to a position well within a plane at the edge of the isolation structures 104 so that doping of the substrate wafer 102, such as the doping of the a P-channel region 110 of the N-MOSFET device 112, is not diminished near the isolation structures 104. Referring to FIG. 2, an overhead view of the substrate wafer 102 shows the position of the isolation structures 104 surrounding the device channel region 110 of the device 112 on four sides. The position of the isolation structures 104 is illustrated relative to the photoresist mask 114 so that the photoresist mask 114 extends across the device channel region 110 to a line 202 overlying the isolation structures 104 a selected distance from the edge of the isolation structures 104. The photoresist mask 114 is recessed a distance ranging from approximately 0.1 μm to 0.5 μm from the edge of the isolation structures 104. A typical recess distance is 0.2 μm to 0.3 μm using current photolithographic techniques. Predictable improvements in photolithographic techniques over time will reduce the recess distances according to alignment and resolution capabilities of the photolithography equipment. The photoresist mask 114 is recessed to allow dopant ions to uniformly diffuse into the device channel region 110 throughout the active region of the device channel region 110 extending fully to the edge of the isolation structures 104.

Referring again to FIG. 1B, ions are implanted into the polysilicon layer 108 in regions that are not protected against doping by the photoresist mask 114. Typically boron fluoride ($BF_2$) molecules are implanted although other dopants, such as boron (B), may alternatively be implanted. Boron is more preferably implanted than $BF_2$ with regard to processing throughput, while $BF_2$ implantation is advantageous for controlling implant uniformity, forming a shallow threshold implant and usage of a thinner polysilicon layer 108.

Following doping of the polysilicon layer 108, an annealing step is performed. Thus, dopant ions, for example Boron Fluoride ($BF_2$) ions, are implanted into the polysilicon layer 108 followed by a Rapid Thermal Anneal (RTA) process that diffuses the Boron ions through the polysilicon layer 108 and oxide layer 106 and uniformly into the device channel region 110. The time duration and temperature of the annealing step are determined in a conventional manner based on Fick's Second Law Equation expressing a physically-based model of impurity diffusion in silicon. This model is based on an assumption that at high temperatures impurities move randomly through the silicon lattice structure to redistribute from high concentration regions to low concentration regions, improving the uniformity of the distribution with increasing diffusion time duration. Typical diffusion durations are on the order of seconds or minutes. Although the diffusion process is described as an RTA process, other alternative annealing processes may be performed including heating using a furnace. Typical annealing temperatures range from about 900° C. to 1000° C. using either RTA or furnace heating techniques.

The annealing process is used to drive the implant through the polysilicon layer 108 into the oxide layer 106 and diffuse the implant ions through the oxide layer 106 into the device channel region 110 into the region of the device that is implanted to set the threshold voltage of the device.

A conventional technique for setting the threshold voltage of devices in an integrated circuit is a threshold implant in which dopant ions are implanted directly into the channel. The illustrative technique for diffusing ions from a polysilicon layer into the channel has many advantages. The diffusion technique for setting the threshold voltage allows very precise control of the dopant concentration in the device channel region 110. Furthermore, the diffusion process permits a substantially shallower dopant profile than is possible using a threshold implant. The diffusion technique produces doping profiles at shallow depths while dopants are implanted at conventional implant energies since dopant molecules are implanted into the polysilicon layer 108 at the surface of the substrate wafer 102 rather than into the device channel region 110. The diffusion technique advantageously allows doping of a particular type of devices without contaminating complementary devices.

Figure 1C:
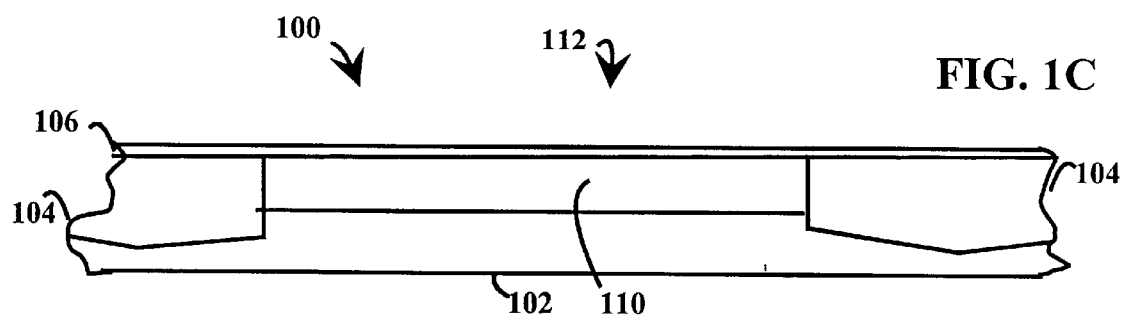
Figure 1D:
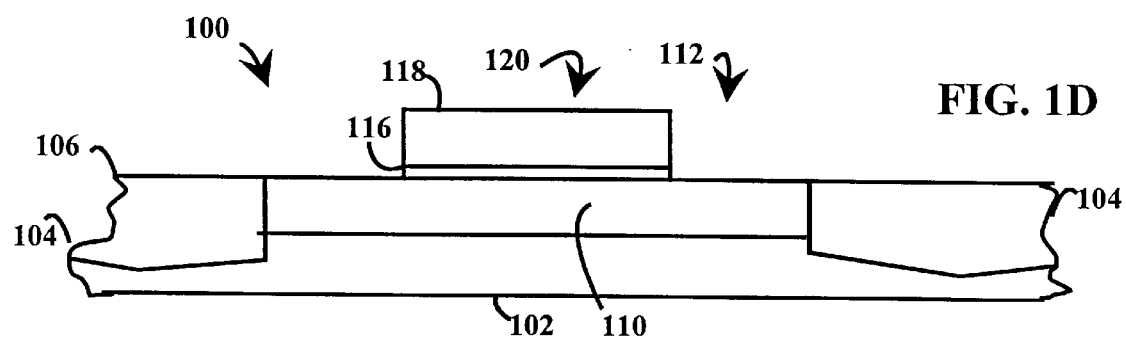

Referring to FIG. 1C, a cross-sectional view shows the substrate wafer 102 following etching of the polysilicon layer 108, generally using a plasma etch or wet etch to remove the polysilicon layer 108. A "quick dip" wet etch process is then used to strip or remove the 30 Å to 50 Å oxide layer 106 as is illustrated in FIG. 1D.

Following stripping of the oxide layer 106, conventional integrated circuit fabrication techniques are used to fabricated desired transistors and devices on the substrate wafer 102. A typical device fabrication includes the steps of growing a gate oxide layer 116, and depositing and etching a gate polysilicon layer 118 to form a polysilicon gate 120 overlying the device channel region 110 having a threshold voltage set using the dopant diffusion technique.

While the invention has been described with reference to various embodiments, it will be understood that these embodiments are illustrative and that the scope of the invention is not limited to them. Many variations, modifications, additions and improvement of the embodiments described are possible. The invention is defined by the appended claims in light of their full scope of equivalents.

What is claimed is:

1. A method of doping an integrated circuit device channel in a semiconductor substrate laterally enclosed by an isolation structure, the method comprising:

forming a thin oxide layer overlying the integrated circuit device channel and the isolation structure;

depositing a polysilicon blanket layer overlying the thin oxide layer;

patterning a photoresist mask overlying the polysilicon blanket layer, the photoresist mask being patterned in alignment with the isolation structure for uniformly doping the integrated circuit device channel;

implanting dopant impurities into the polysilicon blanket layer;

diffusing the dopant impurities from the polysilicon blanket layer through the thin oxide layer a controlled shallow depth and with a controlled uniform dopant concentration laterally into the integrated circuit device channel;

removing the polysilicon blanket layer; and removing the thin oxide layer.

2. A method according to claim 1 further comprising:

fabricating an integrated circuit device overlying the integrated circuit device channel.

3. A method according to claim 2 wherein the fabricating operation further includes:

forming a gate oxide layer overlying the integrated circuit device channel;

patterning and etching a polysilicon gate overlying the gate oxide layer and the integrated circuit device channel; and implanting dopant impurities directly into the integrated circuit device channel to form source and drain regions of the integrated circuit device.

4. A method according to claim 1 further comprising:

patterning the photoresist mask so that an aperture in the photoresist mask exposing the polysilicon blanket layer extends fully across the integrated circuit device channel to a position overlying the isolation structure recessed from an interface between the integrated circuit device channel and the isolation structure by a selected recess distance.

5. A method according to claim 4 further comprising:

patterning the photoresist mask so that the selected recess length has a range from 0.2 μm to 0.3 μm.

6. A method according to claim 1 further comprising:

forming the isolation structure as a trench oxide structure.

7. A method according to claim 1 further comprising:

forming the isolation structure as a Local Oxidation of Silicon (LOCOS) structure.

8. A method according to claim 1 further comprising:

implanting dopant impurities including implanting boron into the polysilicon blanket layer.

9. A method according to claim 1 further comprising:

implanting dopant impurities including implanting boron fluoride ($BF_2$) into the polysilicon blanket layer.

10. A process for fabricating a semiconductor device in a semiconductor substrate comprising:

defining an integrated circuit device channel in the semiconductor substrate;

forming an isolation structure laterally enclosing the integrated circuit device channel;

forming a thin oxide layer overlying the semiconductor substrate and extending over the integrated circuit device channel;

depositing a polysilicon blanket layer overlying the thin oxide layer;

patterning a photoresist mask overlying the polysilicon blanket layer in alignment with the isolation structure, the pattern being selected to uniformly dope the integrated circuit device channel;

implanting dopant impurities into the polysilicon blanket layer in regions unprotected by the photoresist mask;

diffusing the dopant impurities from the polysilicon blanket layer through the thin oxide layer a controlled shallow depth and with a controlled uniform dopant concentration laterally into the integrated circuit device channel;

removing the polysilicon blanket layer; and removing the thin oxide layer.

11. A process according to claim 10 further comprising:

fabricating an integrated circuit device overlying the integrated circuit device channel.

12. A process according to claim 11 wherein the fabricating operation further includes:

forming a gate oxide layer overlying the integrated circuit device channel;

patterning and etching a polysilicon gate overlying the gate oxide layer and the integrated circuit device channel; and implanting dopant impurities directly into the integrated circuit device channel to form source and drain regions of the integrated circuit device.

13. A process according to claim 10 further comprising:

patterning the photoresist mask so that an aperture in the photoresist mask exposing the polysilicon blanket layer extends fully across the integrated circuit device channel to a position overlying the isolation structure recessed from an interface between the integrated circuit device channel and the isolation structure by a selected recess distance.

14. A process according to claim 13 further comprising:

patterning the photoresist mask so that the selected recess length has a range from 0.2 μm to 0.3 μm.

15. A process according to claim 10 further comprising:

forming the isolation structure a trench oxide structure.

16. A process according to claim 10 further comprising:

forming the isolation structure a Local Oxidation of Silicon (LOCOS) structure.

17. A process according to claim 10 further comprising:

implanting dopant impurities including implanting boron into the polysilicon blanket layer.

18. A process according to claim 10 further comprising:

implanting dopant impurities including implanting boron fluoride ($BF_2$) into the polysilicon blanket layer.

* * * * *